(12) United States Patent
Chen

(10) Patent No.: US 6,759,885 B2
(45) Date of Patent: Jul. 6, 2004

(54) SELF-CALIBRATING CLOCK GENERATOR FOR GENERATING PROCESS AND TEMPERATURE INDEPENDENT CLOCK SIGNALS

(75) Inventor: Juinn-Yan Chen, Fremont, CA (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/064,610

(22) Filed: Jul. 30, 2002

(65) Prior Publication Data

US 2004/0021495 A1 Feb. 5, 2004

(51) Int. Cl.[7] ............................................. H03K 3/00
(52) U.S. Cl. ........................................ 327/291; 327/292
(58) Field of Search ............................... 327/291, 292, 327/293, 294, 295, 296, 299

(56) References Cited

U.S. PATENT DOCUMENTS

| | | | | |
|---|---|---|---|---|
| 5,179,438 A | * | 1/1993 | Morimoto | 348/536 |
| 6,147,527 A | * | 11/2000 | Lee et al. | 327/141 |
| 2002/0017939 A1 | * | 2/2002 | Okuda et al. | 327/296 |

* cited by examiner

Primary Examiner—Linh M. Nguyen
(74) Attorney, Agent, or Firm—Winston Hsu

(57) ABSTRACT

A clock analyzer includes an input port for receiving a reference clock signal from an external source, a plurality of functionally identical delay cells for delaying the reference clock signal and generating a plurality of delayed clock signals, each delayed clock signal being delayed by a unique number of delay cells, and at least one comparator for comparing the reference clock signal to the plurality of delayed clock signals and choosing a selected clock signal from the plurality of delayed clock signals that at least partially overlaps the reference clock signal.

11 Claims, 9 Drawing Sheets

SELF-CALIBRATING CLOCK GENERATOR FOR GENERATING PROCESS AND TEMPERATURE INDEPENDENT CLOCK SIGNALS

BACKGROUND OF INVENTION

1. Field of the Invention

The present invention relates to a clock generator, and more specifically, to a self-calibrating clock generator that can automatically measure the delay of an internal delay cell.

2. Description of the Prior Art

Clock generators are used in a wide range of electronic devices such as computers and communication equipment, which have specific timing requirements. Often times, delay cells are used to produce delayed versions of an original clock. Please refer to FIG. 1. FIG. 1 is a block diagram of a clock generator 10 according to the prior art. A clock signal CLK is fed into the clock generator 10, which contains a plurality of delay cells 12 cascaded together in series. The clock signal CLK is fed from an external source, and has a reliable and consistent frequency. Each delay cell 12 has an input and an output, and can delay an inputted signal by a specific amount of time. Delayed clock signals, Delayed_CLK1 to Delayed_CLKn, are generated from the series of delay cells 12, with one delayed clock being taken from the output of each delayed cell.

By producing the series of delayed clocks, the clock generator 10 can produce different frequency clocks by using logic to combine the clock signal CLK with one of the delayed clock signals. For instance, suppose that Delayed_CLK3 is delayed by exactly half of a period of clock signal CLK. A clock with twice the frequency of clock signal CLK can be generated by producing a new clock signal which is formed by using an AND gate to produce CLK AND Delayed_CLK3. Use of clock generators to perform this function is well known in the art, and for brevity, will not be further explained.

Unfortunately, delay cells 12 in the prior art clock generator 10 do not have a consistent delay time. Variations in manufacturing processes and variations in operating temperature can change the delay time that delay cells 12 provide. Designers of the clock generator 10 usually take the design of the delay cells 12 from a cell library that has common circuit modules already pre-built. Assuming worst-case variations in manufacturing processes and operating temperature, the actual delay time of the delay cells 12 can vary threefold. For example, it is possible for a minimum delay time of a delay cell 12 to be 0.61 ns and for the maximum delay time to be 1.84 ns. Clearly, this inconsistency in the delay time of delay cells 12 limits the ability of the clock generator 10 to generate accurate output clock signals.

SUMMARY OF INVENTION

It is therefore a primary objective of the claimed invention to provide a self-calibrating clock generator with a clock analyzer for generating process and temperature independent clock signals in order to solve the above-mentioned problems.

According to the claimed invention, a clock analyzer includes an input port for receiving a reference clock signal from an external source, a plurality of functionally identical delay cells for delaying the reference clock signal and generating a plurality of delayed clock signals, each delayed clock signal being delayed by a unique number of delay cells, and at least one comparator for comparing the reference clock signal to the plurality of delayed clock signals and choosing a selected clock signal from the plurality of delayed clock signals that at least partially overlaps the reference clock signal.

It is an advantage of the claimed invention that the clock analyzer is able to calculate the exact delay time of each delay cell. Using this delay time, the clock generator is able to accurately generate process and temperature independent clock signals.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
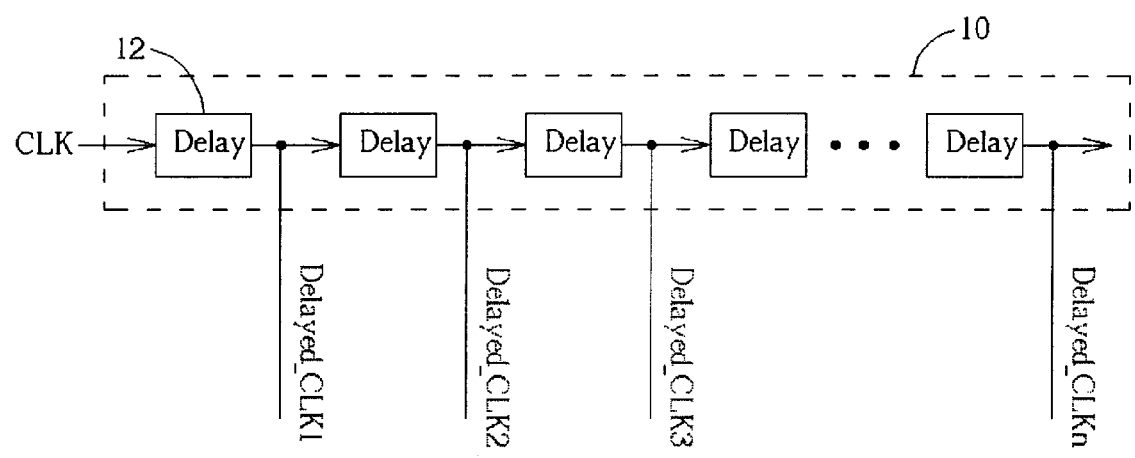
FIG. 1 is a block diagram of a clock generator according to the prior art.
Figure 2:
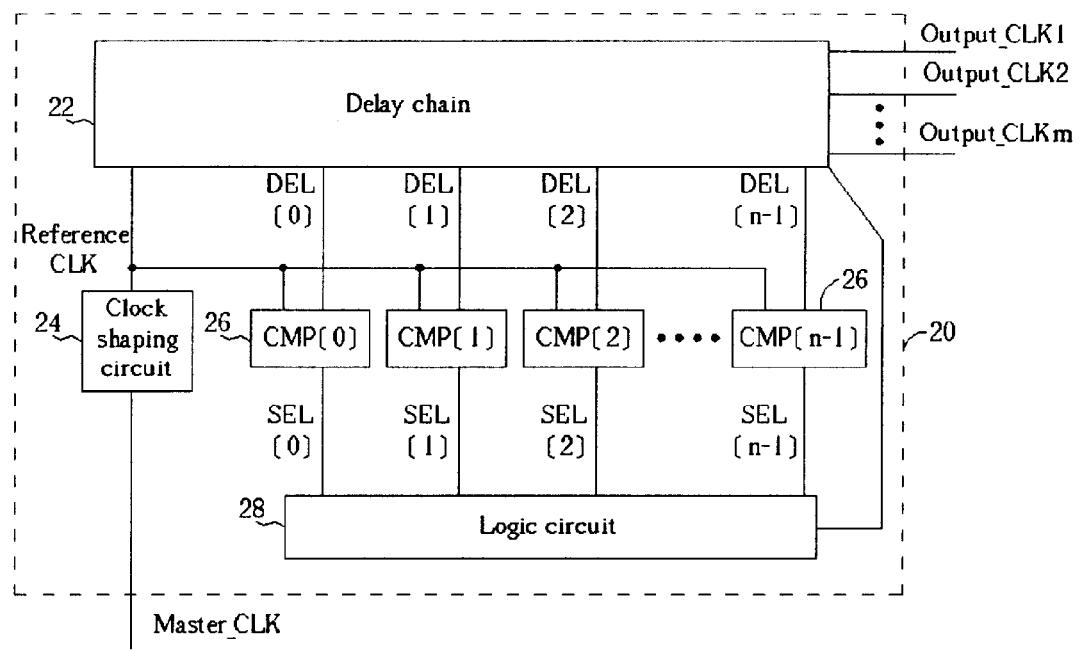
FIG. 2 is a block diagram of a self-calibrating clock generator according to the present invention.

Please refer to FIG. 2. FIG. 2 is a block diagram of a self-calibrating clock generator 20 according to the present invention. The clock generator 20 includes a delay chain 22 with a plurality of delay cells, a clock shaping circuit 24, a plurality of comparators 26, and a logic circuit 28. A master clock signal Master_CLK with a predetermined period is inputted to the clock generator 20 from an external source. The Master_CLK signal is a high-precision signal, which guarantees the quality of clock signals that the clock generator 20 can generate. The Master_CLK signal is then reshaped by the clock shaping circuit 24, which produces a Reference_CLK signal. The Reference_CLK and Master_CLK signals each have the same period, but have different duty cycles as a result of the clock shaping circuit 24.

In order to calibrate the clock generator 20, the Reference_CLK is then inputted into the delay chain 22 for producing a plurality of delayed signals DEL[0] to DEL[n-1]. Each delayed signal is delayed by a different amount, which produces many delayed versions of the Reference_CLK. Then, each delayed signal is then fed into a corresponding comparator 26 for comparing the delayed signal with the Reference_CLK signal. These comparators 26 output selection signals SEL[0] to SEL[n-1], which indicate whether waveform pulses of the corresponding delayed signal overlap waveform pulses of the Reference_CLK signal. Finally, these selection signals are fed into a logic circuit 28 for computing the delay time of delay cells in the delay chain 22. Once the delay time has been calculated, generated clock signals Output_CLK1 to Output_CLKm are outputted from the clock generator 20. The clock generator 20 will be described in further detail in the following figures.

Figure 3:
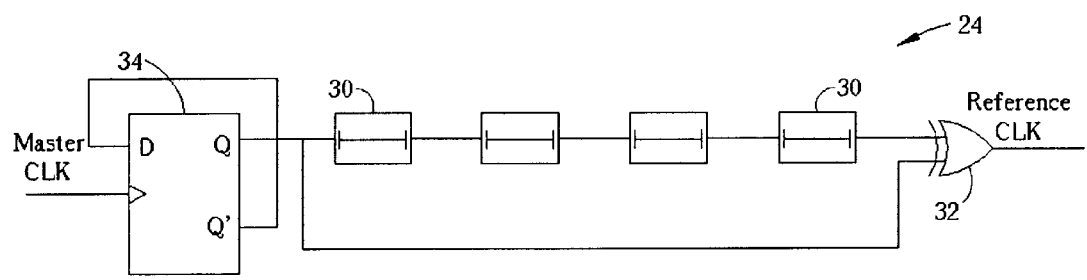
FIG. 3 is a detailed diagram of the clock shaping circuit of the clock generator.
Figure 4:
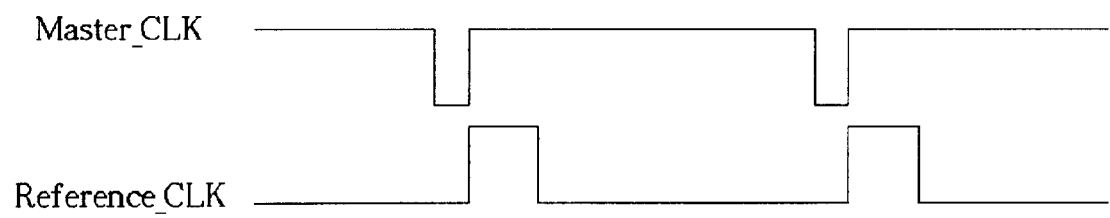
FIG. 4 is a timing diagram illustrating clock shaping results.

Please refer to FIG. 3 and FIG. 4. FIG. 3 is a detailed diagram of the clock shaping circuit 24 of the clock generator 20. FIG. 4 is a timing diagram illustrating clock shaping results. The clock shaping circuit 24 has a flip-flop 34, at least one delay cell 30 (four are shown in this example) and an XOR gate 32. The flip-flop 34 has an input port D, an output node Q and an output node Q". The output node Q" is directly connected to the input node D so that a feedback loop is established with the flip-flop 34. The Master_CLK signal is fed into the flip-flop 34 for inputting a value located at input node D to the flip-flop 34. For example, suppose that initial values on the nodes of the flip-flop 34 are "0" at nodes D and Q", and "1" at node Q. Also, assume that all flip-flop transitions shown in the description of the present invention are active on the rising edge of an input clock.

When a rising edge of Master_CLK enters the flip-flop 34, the value on output node Q becomes "1". This value travels along two paths: through the four delay cells 30 to the XOR gate 32, and directly to the XOR gate 32. Since one of these paths has four delay cells 30 in it, the value "1" will have a delayed arrival at the XOR gate 32. Thus, for a period of time equaling delay of four delay cells 30, the XOR gate 32 will have unequal values as input. The result of this is a "1" value on the Reference_CLK outputted from the XOR gate 32 that lasts for a four-delay time period. After this four-delay time period, the XOR gate 32 has equal input values, and the Reference_CLK will have a "0" value for the remainder of the clock period. Thus, the Reference_CLK is simply a reshaped version of the Master_CLK, with exactly the same frequency. As shown in FIG. 4, the Master_CLK has a high duty cycle, but the Reference_CLK has a much lower duty cycle with a "1" value lasting for a four-delay time period. In fact, by using the clock shaping circuit 24, it does not matter what the duty cycle of the Master_CLK is. As shown below, with use of the clock shaping circuit 24, the clock generator 20 can more easily determine the exact delay time of a delay cell 30.

Figure 5:
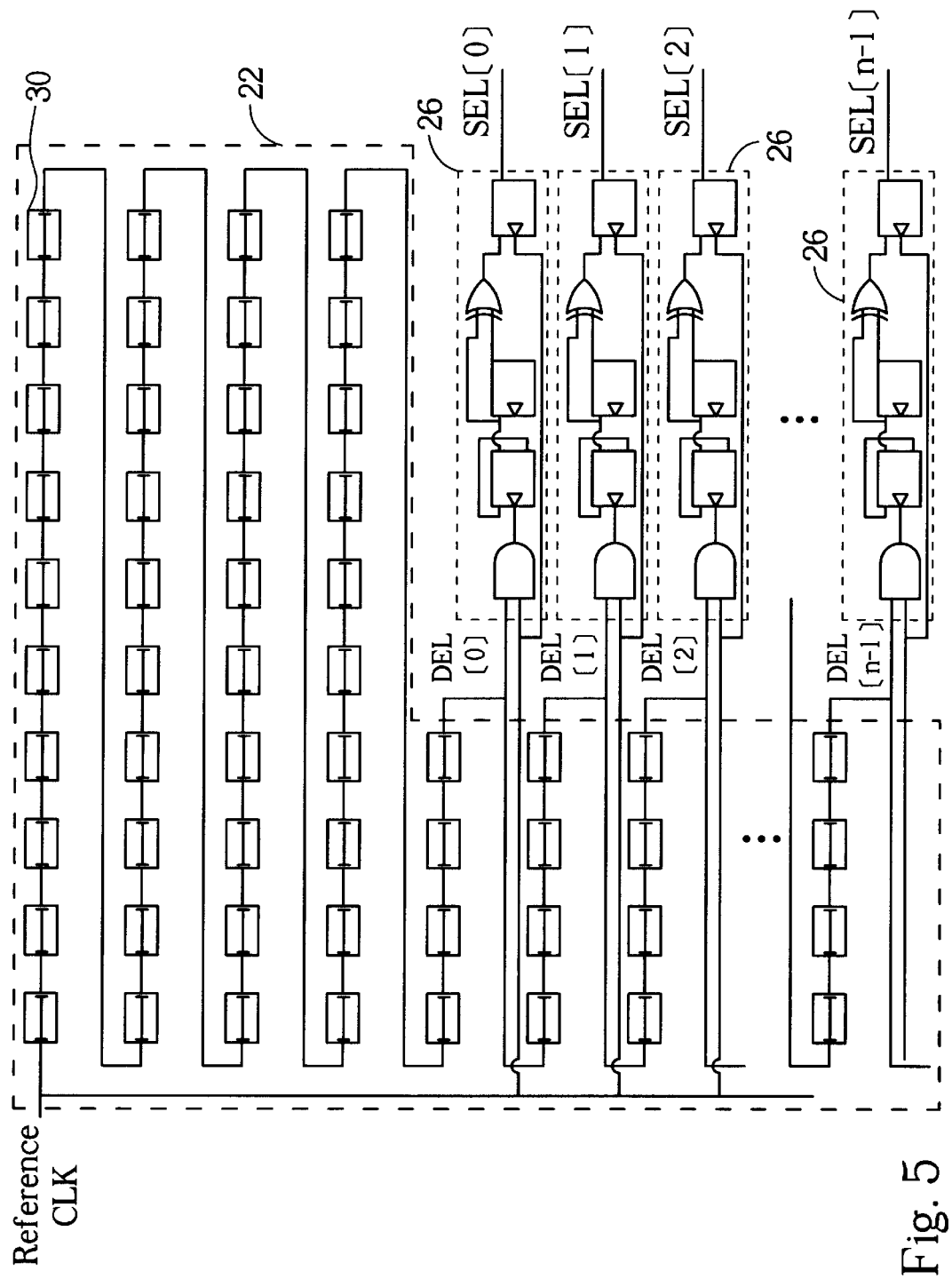
FIG. 5 is a detailed diagram of the delay chain and the comparators.

Please refer to FIG. 5. FIG. 5 is a detailed diagram of the delay chain 22 and the comparators 26. The delay chain 22 contains a large number of delay cells 30, which are used to delay the Reference_CLK by different delay amounts. The structure of FIG. 5 is used only as an example. In practice, the number delay cells 30 used can vary according to specifications used in the design of the clock generator 20. In this example, the Reference_CLK is delayed by 44 delay cells 30 before reaching a first comparator 26. The Reference_CLK that is delayed by a 44-delay time period then travels through the first comparator 26, and the selection signal SEL[0] is generated. For generating additional selection signals, each subsequent selection signal is delayed by another four delay cells 30. Therefore, the Reference_CLK delayed by a 48-delay time period produces SEL[1], the Reference_CLK delayed by a 52-delay time period produces SEL[2], and so forth. The purpose of the comparators 26 is to compare delayed versions of the Reference_CLK with the actual Reference_CLK. That is, the comparators determine if a delayed first period of the Reference_CLK overlaps a second period of the Reference_CLK. If so, the corresponding selection signal is identified, and the number of delay cells 30 connected to the comparator 26 which produced the selection signal is calculated. As shown in FIG. 2, the logic circuit 28 can then calculate the delay time of each delay cell 30 by dividing the period of the Reference_CLK by the number of delay cells 30 connected to the identified comparator 26.

Figure 6:
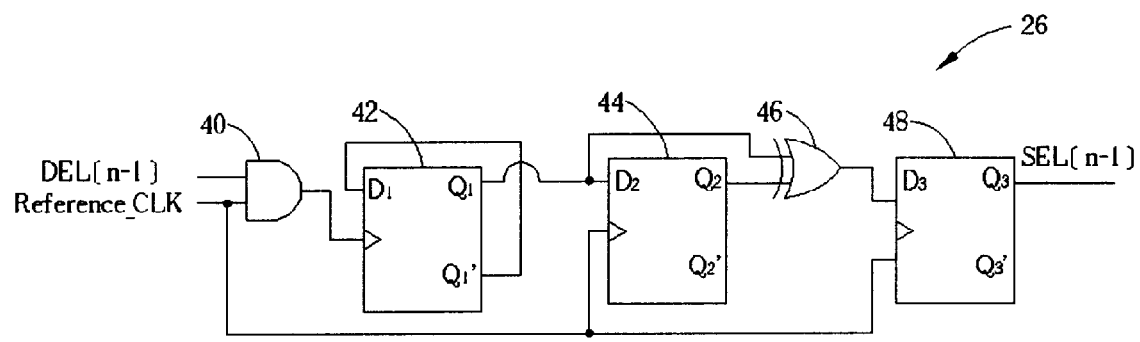
FIG. 6 is a detailed diagram of the comparator.
Figure 7A:
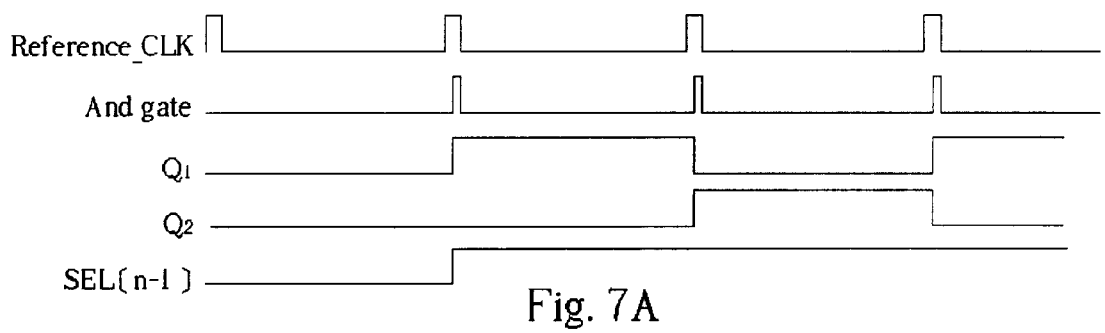
FIG. 7A is a timing diagram illustrating generation of a selection signal corresponding to a delayed reference clock that overlaps the original reference clock.
Figure 7B:
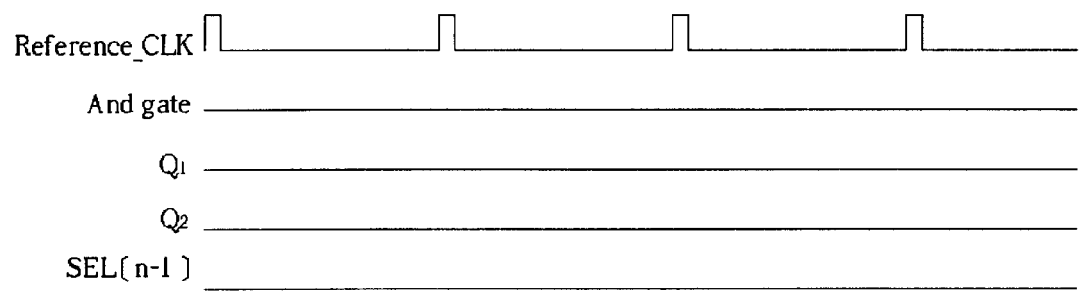
FIG. 7B is a timing diagram illustrating generation of a selection signal corresponding to a delayed reference clock that does not overlap the original reference clock.

Please refer to FIG. 6, FIG. 7A, and FIG. 7B. FIG. 6 is a detailed diagram of the comparator 26. FIG. 7A is a timing diagram illustrating generation of a selection signal corresponding to a delayed Reference_CLK that overlaps the original Reference_CLK. FIG. 7B is a timing diagram illustrating generation of a selection signal corresponding to a delayed Reference_CLK that does not overlap the Reference_CLK. As an example, these three figures will use delayed signal DEL[n−1] and selection signal SEL[n−1] for illustration purposes. In the comparator 26, both the delayed signal DEL[n−1] and the Reference_CLK are fed into an AND gate 40. This means that only when the two signals overlap will the AND gate 40 output a "1" value. The comparator 26 also includes first, second, and third flip-flops 42, 44, 48, and an XOR gate 46. The first flip-flop 42 has an output node Q1" directly connected to an input node D1. This causes the output Q1 to toggle between "1" and "0" with each pulse of the Reference_CLK. The output node Q1 is connected directly to the XOR gate 46 and also to an input node D2 of the second flip-flop 44. Thus, an output Q2 of the second flip-flop 44 is exactly the opposite of Q1.

Since Q1 and Q2 are both fed into the XOR gate 46, the output of the XOR gate 46 will always be 1 when DEL[n−1] overlaps the Reference_CLK. The output of the XOR gate 46 is fed into the third flip-flop 48 at input node D3, and output Q3 of the third flip-flop 48 is labeled as SEL[n−1]. Consequently, as shown in FIG. 7A, SEL[n−1] will have a constant value of "1" when DEL[n−1] overlaps the Reference_CLK. On the other hand, as shown in FIG. 7B, SEL[n−1] will have a constant value of "0" when DEL[n−1] does not overlap the Reference_CLK.

Figure 8:
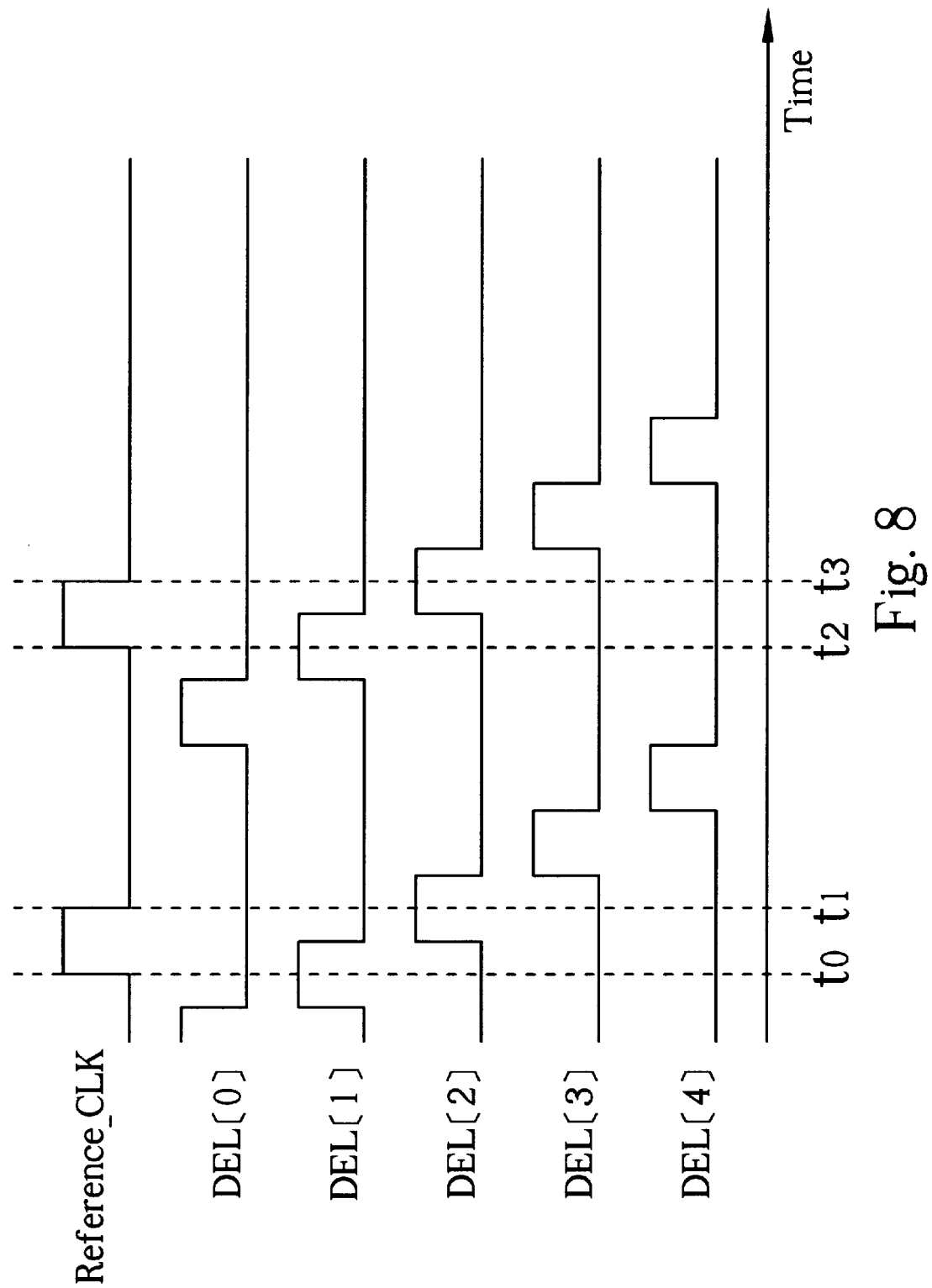
FIG. 8 is a timing diagram illustrating comparison of the reference clock to delayed clocks.

Please refer to FIG. 8. FIG. 8 is a timing diagram illustrating comparison of the Reference_CLK to delayed clocks. Five delayed signals DEL[0], DEL[1], DEL[2], DEL[3], and DEL[4] are shown with respect to the original Reference_CLK. FIG. 8 is used only as an example, and numbers are chosen for ease of explanation. In FIG. 8, a second and a third pulse of Reference_CLK are shown. For the sake of the following discussion, a pulse will refer to the binary "1" part of a clock period. A first pulse of the Reference_CLK is not shown because the first pulse cannot be compared with the delayed signals in real time. In order to properly calibrate the clock generator 20, comparators 26 determine which delayed signal has a pulse that overlaps a pulse of the Reference_CLK. The second pulse of Reference_CLK begins at time t0 and ends at time t1. Likewise, a third pulse of the Reference_CLK begins at time t2 and ends at time t3. Either the second, the third, or any subsequent pulse of the Reference_CLK can be used for comparison with the delayed signals. However, for this example, only the second pulse will be used.

As shown in FIG. 8, delayed signal DEL[0] does not overlap the second pulse of the Reference_CLK since it ends before time t0. However, delayed signal DEL[1] overlaps the second pulse of the Reference_CLK since it ends between times t0 and t1. Likewise, delayed signal DEL[2] also overlaps the second pulse of the Reference_CLK since it begins between times t0 and t1. Neither delayed signal DEL[3] nor DEL[4] overlap the second pulse of the Reference_CLK, and are not used in calibration. In summary, both delayed signal DEL[1] and DEL[2] overlap the second pulse of the Reference_CLK, and either one could be used to aid in calibration. Corresponding selection signals SEL[1] and SEL[2] would both have a constant value of "1". For simplicity, however, only delayed signal DEL[1] will be used in the following explanation of the calibration process.

The next step in the calibration process is to calculate the exact delay time of each delay cell 30. This can be done by dividing the period of the Reference_CLK by the number of delay cells that the delay signal DEL[1] was delayed by. For example, suppose that the delay signal DEL[1] was delayed by 48 delay cells 30. Also, suppose that the Reference_CLK has a frequency of 12.288 MHz, or a period of 81.38 ns. Then, the delay time of each delay cell 30 is computed to be 81.38 ns/48=1.69 ns. With this information in hand, the clock generator 20 can accurately generate additional clock signals by computing exactly how many delay cells 30 are necessary to produce a desired delay time.

Compared to the prior art, the clock generator 20 of the present invention is able to calculate the delay time of each delay cell 30 in the delay chain 22. Because the delay time can vary due to changes in manufacturing processes and temperature, knowing the exact delay time for each delay cell 30 is essential when generating outputted clock signals. The present invention clock generator 20 is self-calibrating, and can calibrate as often as desired. For instance, the clock generator could be programmed to calibrate every 10 minutes, or whenever a temperature change larger than a threshold value is detected. Therefore, the clock generator 20 can work in all environments.

Those skilled in the art will readily observe that numerous modifications and alterations of the device may be made while retaining the teachings of the invention. For example, although the preferred embodiment of the present invention utilizes a plurality of comparators to simultaneously check a plurality of delayed clock signals, it is fully possible to construct an alternative embodiment that uses a single comparator that compares the reference clock signal to a selected delayed clock signal that comes from a selecting unit. The selector would select one of the plurality of delayed clock signals, and feed this selected delayed clock signal to the comparator. When the comparator generates an output affirming that the selected delayed clock signal overlaps the reference clock signal, the delayed clock signal that is selected by the selector is noted by the logic circuit and timing determination proceeds accordingly. Otherwise, the selector is instructed to select another delayed clock signal from the plurality of delayed clock signals, and feed this newly selected clock signal into the comparator. Proceeding in such a serial fashion, all of the delayed clock signals can be tested until one (or more) is found that overlaps the reference clock signal. Accordingly, the above disclosure should be construed as limited only by the metes and bounds of the appended claims.

What is claimed is:

1. A clock analyzer comprising:
    a delay circuit having:
        an input port for receiving a reference clock signal from a clock source having a predetermined clock period;
        a plurality of functionally identical delay cells, each delay cell generating an approximately identical delay period of an input clock signal; and
        a plurality of output ports, each output port connected to the input port through a predetermined number of the delay cells for generating a delayed clock signal from the reference clock signal;
    at least one comparator circuit each having two input ports and one selection line as an output port wherein the two input ports of each comparator circuit are connected to the input port and one unique output port of the delay circuit, and each comparator circuit compares the reference clock signal to the delayed clock signal from the corresponding unique output port of the delay circuit and generates a selection signal on the selection line when the delayed clock signal overlaps the reference clock signal; and
    a clock shaping circuit for accepting a master clock signal having the predetermined clock period and generating the reference clock signal that has a duty cycle differing from the duty cycle of the master clock signal, the clock shaping circuit comprising at least one of the functionally identical delay cells;
    wherein the delay period of each of the delay cells is approximately determined by identifying the specific output port of the delay circuit which generates the selection signal.

2. The clock analyzer of claim 1 wherein the delay period of each of the delay cells is calculated by dividing the clock period of the clock source by the number of delay cells connected between the input port of the delay circuit and one of the input ports of the specific output port of the delay circuit that is associated with the selection signal.

3. The clock analyzer of claim 1 wherein all the delay cells of the delay circuit are connected in series to form a delay line and each of the output ports is connected to a separate connecting portion between two neighboring delay cells of the delay line.

4. The clock analyzer of claim 3 wherein the number of delay cells between any two neighboring output ports of the delay line is identical.

5. A clock analyzer comprising:
    an input port for receiving a reference clock signal from an external source;
    a plurality of functionally identical delay cells for delaying the reference clock signal and generating a plurality of delayed clock signals, each delayed clock signal being delayed by a unique number of delay cells;
    at least one comparator for comparing the reference clock signal to the plurality of delayed clock signals and choosing a selected clock signal from the plurality of delayed clock signals that at least partially overlaps the reference clock signal; and
    a logic circuit connected to an output of the comparator, the logic circuit for calculating an approximate delay time of each of the delay cells utilized to generate the selected clock signal.

6. The clock analyzer of claim 5 wherein the delay time of each delay cell is calculated by dividing a period of the reference clock signal by the number of delay cells utilized to generate the selected clock signal.

7. The clock analyzer of claim 5 wherein the plurality of delay cells are connected in series to form a chain of functionally identical delay cells.

8. The clock analyzer of claim 5 wherein the delay period of the delay cells is in the range of 0.61 to 1.84 nanoseconds (ns).

9. The clock analyzer of claim 5 further comprising a clock shaping circuit for accepting a master clock signal having the predetermined clock period and generating the reference clock signal that has a duty cycle differing from the duty cycle of the master clock signal, the clock shaping circuit comprising at least one of the functionally identical delay cells.

10. A method of calibrating a clock generator, the method comprising:

receiving a reference clock signal from an external source;

generating a plurality of delayed clock signals from the reference clock signal, each delayed clock signal being delayed by a unique number of delay cells;

comparing the reference clock signal to the plurality of delayed clock signals and choosing a selected clock signal from the plurality of delayed clock signals that at least partially overlaps the reference clock signal;

calculating an approximate delay time of each of the delay cells utilized to generate the selected clock signal by dividing a period of the reference clock signal by the number of delay cells utilized to generate the selected clock signal; and utilizing the calculated delay time of each of the delay cells to determine the number of delay cells necessary to delay the reference clock signal by a predetermined delay time.

11. The method of claim 10 further comprising generating the reference clock signal from a master clock signal utilizing at least one of the delay cells so that the reference clock signal has a duty cycle differing from the duty cycle of a master clock signal.

* * * * *